United States Patent
Wilson et al.

(10) Patent No.: US 7,816,718 B2
(45) Date of Patent: Oct. 19, 2010

(54) INTERCONNECT FOR A GMR MEMORY CELLS AND AN UNDERLYING CONDUCTIVE LAYER

(75) Inventors: Vicki Wilson, Saint Paul, MN (US); Guoqing Zhan, Saint Paul, MN (US); Ray Buske, Saint Paul, MN (US); James Chyi Lai, Saint Paul, MN (US)

(73) Assignee: Northern Lights Semiconductor Corp., St. Paul, MN (US)

( * ) Notice: Subject to any disclaimer, the term of this patent is extended or adjusted under 35 U.S.C. 154(b) by 0 days.

(21) Appl. No.: 12/417,681

(22) Filed: Apr. 3, 2009

(65) Prior Publication Data

US 2009/0233381 A1 Sep. 17, 2009

Related U.S. Application Data

(63) Continuation-in-part of application No. 11/533,077, filed on Sep. 19, 2006, now abandoned.

(60) Provisional application No. 60/721,359, filed on Sep. 28, 2005.

(51) Int. Cl.
*H01L 21/302* (2006.01)

(52) U.S. Cl. .............. 257/295; 257/427; 257/E21.665; 438/689; 438/3; 365/158

(58) Field of Classification Search .......... 438/689, 438/268, 3, 382, 257; 257/295, 427, E21.665; 365/158
See application file for complete search history.

(56) References Cited

U.S. PATENT DOCUMENTS

| 6,783,995 | B2 * | 8/2004 | Hineman et al. ............... 438/3 |
| 6,911,156 | B2 * | 6/2005 | Grynkewich et al. .......... 216/22 |
| 2002/0146849 | A1 * | 10/2002 | Durcan et al. .................. 438/3 |
| 2003/0042562 | A1 * | 3/2003 | Giebeler et al. ............. 257/421 |
| 2004/0188731 | A1 * | 9/2004 | Boeve ........................ 257/295 |
| 2005/0161715 | A1 * | 7/2005 | Perner et al. ................ 257/295 |
| 2007/0242394 | A1 | 10/2007 | Gill |

* cited by examiner

*Primary Examiner*—Davienne Monbleau
*Assistant Examiner*—Shweta Mulcare
(74) *Attorney, Agent, or Firm*—Thomas, Kayden, Horstemeyer & Risley, LLP

(57) ABSTRACT

A conductive plug located in a planar dielectric layer, under GMR memory cells, are used to directly connect the lower ferromagnetic layer of one of the GMR memory cell and a conductive layer under the planar dielectric layer.

6 Claims, 2 Drawing Sheets

INTERCONNECT FOR A GMR MEMORY CELLS AND AN UNDERLYING CONDUCTIVE LAYER

CROSS-REFERENCE TO RELATED APPLICATION

This application is a continuation-in-part of U.S. application Ser. No. 11/533,077, filed Sep. 19, 2006, which claims the priority benefit of provisional application Ser. No. 60/721,359, filed Sep. 28, 2005, the full disclosures of which are incorporated herein by reference.

BACKGROUND

1. Field of Invention

The present invention relates to a static memory. More particularly, the present invention relates to a magnetoresistive random access memory (MRAM).

2. Description of Related Art

MRAM is a type of non-volatile memory with fast programming time and high density. A MRAM cell of giant magnetoresistance (GMR) type has two ferromagnetic layers separated by a nonmagnetic conductive layer. Information is stored as directions of magnetization vectors in the two ferromagnetic layers.

The resistance of the GMR memory cell indicates a minimum value when the magnetization vectors of the two ferromagnetic layers point in substantially the same direction. On the other hand, the resistance of the GMR memory cell indicates a maximum value when the magnetization vectors of the two ferromagnetic layers point in substantially opposite directions. Accordingly, a detection of changes in resistance allows information being stored in the MRAM cell.

In conventional MRAM architecture, MRAM cells are placed on intersections of cell lines and word lines. The cell lines and word lines connect to the peripheral circuits and/or logic circuits through metal lines and/or metal plugs disposed on the peripheral area surrounding the MRAM area. Hence, the integration density is limited.

SUMMARY

A conductive plug located in a planar dielectric layer, under GMR memory cells, are used to directly connect the lower ferromagnetic layer of one of the GMR memory cell and a conductive layer under the planar dielectric layer.

BRIEF DESCRIPTION OF THE DRAWINGS

The invention can be more fully understood by reading the following detailed description of the preferred embodiment, with reference made to the accompanying drawings as follows.

DETAILED DESCRIPTION

Reference will now be made in detail to the embodiments of the invention, examples of which are illustrated in the accompanying drawings.

Figure 1A:
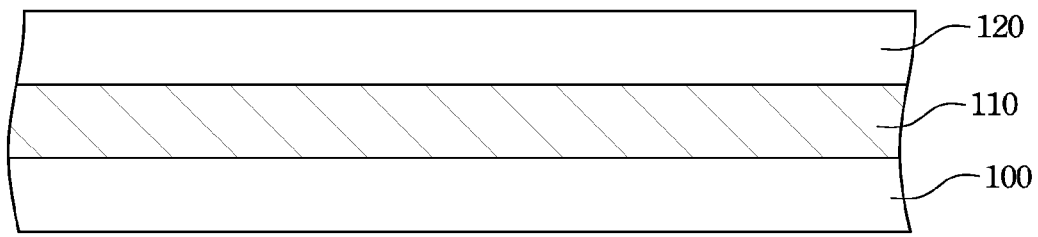
FIGS. 1A-1C are cross-sectional diagrams showing a method of fabricating an interconnect structure according to an embodiment of this invention.
Figure 1B:
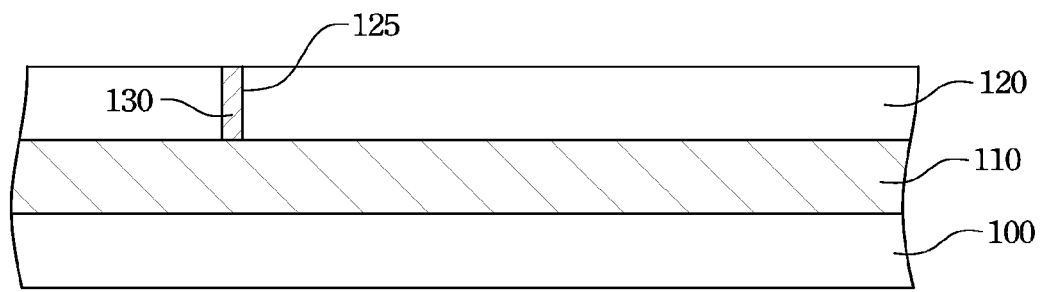
Figure 1C:
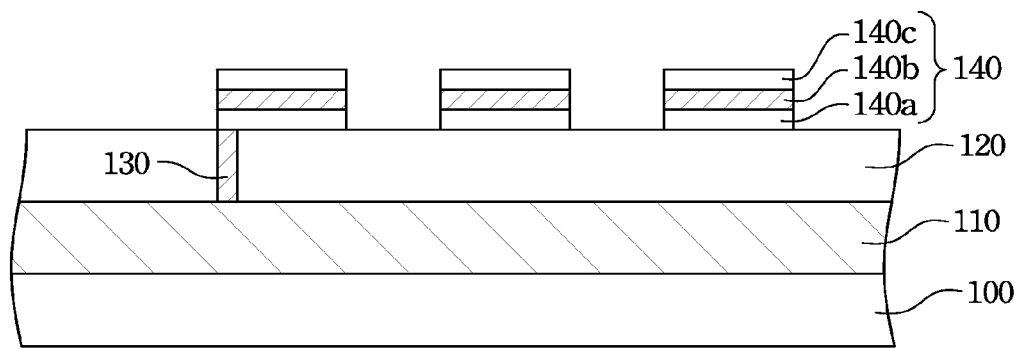

FIGS. 1A-1C are cross-sectional diagrams showing a method of fabricating an interconnect structure according to an embodiment of this invention. In FIG. 1A, a substrate 100 having a patterned conductive layer 110 thereon is provided. Then, a planar first dielectric layer 120 is formed on the conductive layer 110.

The patterned conductive layer 110 represents a conducting circuit, such as a source/drain of a transistor. A material of the patterned conductive layer 110 can be any conductive material, such as doped semiconductor, metal or metal alloy. For example, Cu or Al—Cu alloy are usually used to fabricate interconnects in semiconductor integrated circuits. A material of the first dielectric layer 120 can be silicon oxide, silicon nitride, silicon oxynitride, metal oxide, or other usable dielectric materials, for example. The thickness of the dielectric layer is about 1500-3500 Angstroms, for example.

In FIG. 1B, the first dielectric layer 120 is patterned, such as a photolithography process and an etching process performed sequentially, to form an first opening 125 therein. After depositing a metal in the first opening 125 and on the first dielectric layer 120, a planarization process, such as chemical mechanical polishing (CMP), is performed to planarize the metal layer until the first dielectric layer 120 is exposed. Thus, a first conductive plug 130 is formed in the first opening 125. A material of the first conductive plug 130 can be tungsten or other conductive metals, for example.

In FIG. 1C, a first ferromagnetic layer, a nonmagnetic conductive layer, and a second ferromagnetic layer are sequentially deposited on the first dielectric layer 120 and the first conductive plug 130 and then patterned to form GMR memory cells 140. Each of the GMR memory cells 140 comprises a lower ferromagnetic layer 140a, a nonmagnetic conductive layer 140b, and an upper ferromagnetic layer 140c. The lower ferromagnetic layer 140a of one GMR memory cells 140 directly contact the first conductive plug 130 to build electrical connection. The GMR memory cell 140 directly connecting the first conductive plug 130 is usually located in one end of a GMR memory byte, which includes more than one GMR memory cells.

Figure 1D:
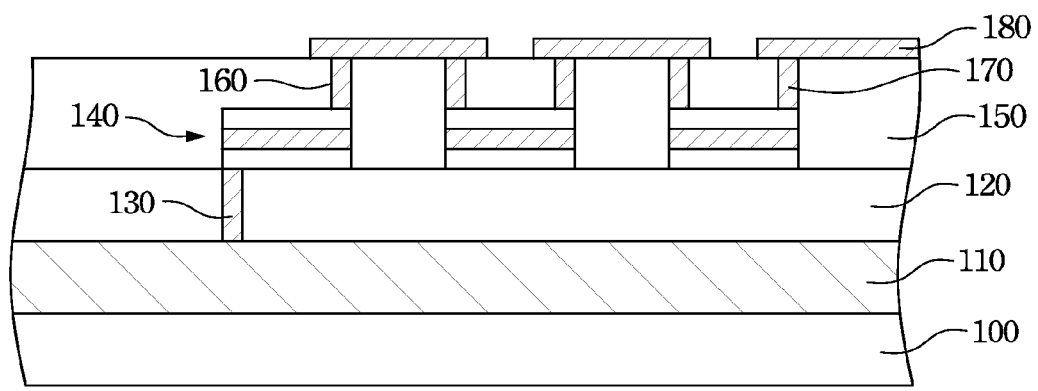
FIG. 1D is a cross-sectional diagram showing a structure of the conductive interconnects between adjacent GMR memory cells according to an embodiment of this invention, for example.

Next, conductive interconnects between adjacent GMR memory cells are formed to connect the adjacent GMR memory cells for forming a GMR memory byte. FIG. 1D is a cross-sectional diagram showing a structure of the conductive interconnects between adjacent GMR memory cells according to an embodiment of this invention, for example. In FIG. 1D, a second dielectric layer 150 can be deposited over the substrate 100 and then patterned to form second openings 160 in the second dielectric layer 150 for exposing the upper ferromagnetic layer 140c of the GMR memory cells 140. Then, second conductive plugs 170 are formed to fill the second openings 160. A conductive layer is deposited and then patterned to form conductive lines 180 connecting adjacent second conductive plugs 170 respectively located on the adjacent GMR memory cells 140. Accordingly, the conductive interconnects connecting the upper ferromagnetic layers 140c of the adjacent GMR memory cells 140 include the second conductive plugs 170 and the conductive lines 180 in FIG. 1D.

According to the embodiment provided above, the first conductive plug is located in the first dielectric layer below the GMR memory cells to connect the underlying conducting circuit. Hence, more options in layout design utilizing the GMR memory cells are allowed. Moreover, since the dielectric layer is thin, the step coverage of metal deposition is good.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating an interconnect for GMR memory cells, comprising;
   forming a planar dielectric layer on a patterned conductive layer, which is on a substrate;
   patterning the dielectric layer to form an opening therein;
   forming a metal plug in the opening, wherein the metal plug is electrically connected to the patterned conductive layer;
   forming GMR memory cells directly on the metal plug and the dielectric layer, wherein a lower ferromagnetic layer of only one of the GMR memory cells directly contacts the metal plug; and
   forming conductive interconnects connecting upper ferromagnetic layers of the adjacent GMR memory cells.

2. The method of claim 1, wherein the dielectric layer is silicon oxide, silicon nitride, or silicon oxynitride.

3. The method of claim 1, wherein the metal plug is a tungsten plug.

4. An interconnect for GMR memory cells and a underlying conductive layer, comprising:
   a patterned conductive layer on a substrate;
   a planar dielectric layer on the conductive layer;
   a metal plug, which is electrically connected to the patterned conductive layer, located in the dielectric layer;
   GMR memory cells on the metal plug and the dielectric layer, wherein a lower ferromagnetic layer of only one of the GMR memory cells directly contacts the metal plug; and
   conductive interconnects connecting upper ferromagnetic layers of the adjacent GMR memory cells.

5. The interconnect of claim 4, wherein the dielectric layer is silicon oxide, silicon nitride, or silicon oxynitride.

6. The interconnect of claim 4, wherein the metal plug is a tungsten plug.

* * * * *